(12) United States Patent
Ahn et al.

(10) Patent No.: US 7,911,225 B2
(45) Date of Patent: Mar. 22, 2011

(54) DATA OUTPUT DEVICE AND SEMICONDUCTOR MEMORY APPARATUS INCLUDING THE SAME

(75) Inventors: Jeong Yoon Ahn, Gyeonggi-do (KR); Ki Ho Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/482,075

(22) Filed: Jun. 10, 2009

(65) Prior Publication Data

US 2010/0060317 A1    Mar. 11, 2010

(30) Foreign Application Priority Data

Sep. 10, 2008    (KR) .................. 10-2008-0089459

(51) Int. Cl.
*H03K 17/16*    (2006.01)
(52) U.S. Cl. .......................................... 326/30
(58) Field of Classification Search ............ 326/30
See application file for complete search history.

(56) References Cited

U.S. PATENT DOCUMENTS

| 6,281,730 | B1 | 8/2001 | Vu |
| 6,285,215 | B1 * | 9/2001 | Voshell ........................ 326/86 |
| 7,035,148 | B2 | 4/2006 | Chung et al. |
| 7,477,081 | B2 * | 1/2009 | Song .......................... 327/108 |
| 2006/0091901 | A1 * | 5/2006 | Kim ............................. 326/30 |
| 2009/0115449 | A1 * | 5/2009 | Kim et al. .................... 326/30 |

FOREIGN PATENT DOCUMENTS

KR    1020070103907 A    10/2007

* cited by examiner

*Primary Examiner* — Rexford N Barnie
*Assistant Examiner* — Thienvu V Tran
(74) *Attorney, Agent, or Firm* — Ladas & Parry LLP

(57) ABSTRACT

A data output device includes a pre-driver unit configured to control a driving force according to an impedance control signal and to drive output data using the driving force. The data output device includes a main-driver unit configured to control an impedance according to pull-up and pull-down resistance control codes having values that correspond to the impedance control signal provided to the pre-driver unit and to drive an output of the pre-driver unit by utilizing the controlled impedance.

11 Claims, 3 Drawing Sheets

DATA OUTPUT DEVICE AND SEMICONDUCTOR MEMORY APPARATUS INCLUDING THE SAME

CROSS-REFERENCES TO RELATED PATENT APPLICATION

The present application claims priority under 35 U.S.C 119(a) to Korean Application No. 10-2008-0089459, filed on Sep. 10, 2008, in the Korean Intellectual Property Office, which is incorporated herein by reference in its entirety as set forth in full.

BACKGROUND

1. Technical Field

The present invention relates to a semiconductor memory apparatus and, more particularly, to a data output device that controls a slew rate of an output signal in response to impedance variation of an output driver and a semiconductor memory apparatus including the same.

2. Related Art

Generally, a semiconductor memory apparatus includes a data output device that drives and outputs data selected by a read command.

The data output device has a structure in which a pre-driver and a main-driver are connected in series to each other. An impedance of the main-driver is controlled so as to match an impedance of a transmission channel in order to support high-speed operation of the semiconductor memory apparatus.

The data output device applies an output signal of the pre-driver to the main-driver irrespective of an impedance variation of the main-driver. As a result, a slew rate of the output signal is varied depending on the impedance of the main-driver, which generates a jitter. Therefore, signal integrity is deteriorated and a data eye is narrowed.

SUMMARY

A data output device that can control a slew rate of an output signal by adjusting a driving force of a pre-driver, which is preloaded in response to impedance variation of a main-driver, is disclosed herein.

Further, a semiconductor memory apparatus that includes the data output device and enhances the integrity and data eye of the output signal is also disclosed herein.

In one embodiment of the present invention, a data output device includes a pre-driver unit configured to control a driving force in response to an impedance control signal and drive data to output by the driving force; and a main-driver unit configured to control an impedance by pull-up and pull-down resistance control codes having values corresponding to the impedance control signal and drive an output of the pre-driver unit by adopting the controlled impedance.

Preferably, the impedance control signal is an address signal provided from a mode register in order to set any one of a first resistance value and a second resistance value larger than the first resistance value as the impedance.

The pre-driver unit may include a pre-driver configured to drive the data to output; and a driving force controller of which driving is controlled in response to the impedance control signal to correct and output a slew rate of a signal outputted from the pre-driver.

The driving force controller may include a driving control signal generator configured to generate pull-up and pull-down driving control signals in response to the impedance control signal; and a driving correction driver of which driving is controlled by the pull-up and pull-down driving control signals to correct the slew rate of the signal outputted from the pre-driver.

The driving control signal generator may include a determination portion configured to determine the impedance set by the impedance control signal and output a determination signal; and an output portion configured to output the pull-up and pull-down driving control signals corresponding to the data in response to the determination signal.

Preferably, the output portion outputs the pull-up and pull-down driving control signals so that the driving correction driver is pull-up or pull-down driven in correspondence with the data when the determination signal is activated.

The driving correction driver may include a pull-up driving portion configured to correct a rising slew rate of the signal outputted from the pre-driver by being pull-up driven by the pull-up driving control signal; and a pull-down driving portion configured to correct a falling slew rate of the signal outputted from the pre-driver by being pull-down driven by the pull-down driving control signal.

Preferably, the pull-up driving portion is a PMOS transistor which is connected between a power voltage terminal and an output terminal of the pre-driver and is controlled by the pull-up driving control signal applied to a gate thereof.

Preferably, the pull-down driving portion is an NMOS transistor which is connected between the output terminal of the pre-driver and a ground voltage terminal and is controlled by the pull-down driving control signal applied to a gate thereof.

The main-driver unit may include a main-driver configured to drive the signal outputted from the pre-driver unit; a pull-up resistor which is connected between the power voltage terminal and an output terminal of the main-driver and controls a pull-up resistance of the impedance by the pull-up resistance control code; and a pull-down resistor which is connected between the ground voltage terminal and the output terminal of the main-driver and controls a pull-down resistance of the impedance by the pull-down resistance control code.

In another embodiment of the present invention, a semiconductor memory apparatus includes a calibration section configured to output pull-up and pull-down resistance control codes for matching an impedance in response to an impedance control signal; a pre-driver unit configured to control a driving force in response to the impedance control signal and drive data to output by the driving force; and a main-driver unit configured to control the impedance by the pull-up and pull-down resistance control codes and drive an output of the pre-driver unit by adopting the controlled impedance.

Preferably, the impedance control signal is an address signal provided from a mode register in order to set any one of a first resistance value and a second resistance value larger than the first resistance value as the impedance.

The pre-driver unit may include a pre-driver configured to drive the data to output; a driving control signal generator configured to generate pull-up and pull-down driving control signals corresponding to the data in response to the impedance control signal; and a driving correction driver which is driven by the pull-up and pull-down driving control signals and controls a slew rate of a signal outputted from the pre-driver.

Preferably, the driving control signal generator outputs the pull-up and pull-down driving control signals in correspondence with the data when the impedance is set to the second resistance value by the impedance control signal.

Preferably, the driving correction driver is pull-up or pull-down driven by the pull-up and pull-down driving control signals to increase a rising slew rate or a falling slew rate of the signal outputted from the pre-driver.

The main-driver unit may include a main-driver configured to drive the signal outputted from the pre-driver unit; and a resistor which is connected to an output terminal of the main-driver to control the impedance by the pull-up and pull-down resistance control codes.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

The present invention is configured to control a driving force of a pre-driver, which is preloaded in response to an impedance variation of a main-driver of a data output device.

Figure 1:
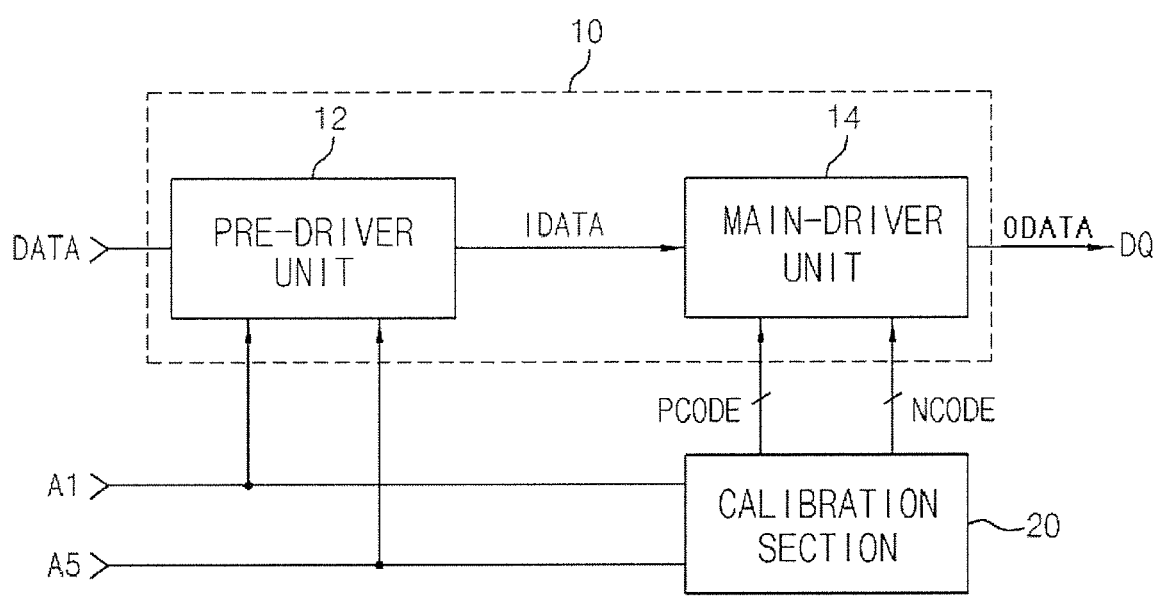
FIG. 1 is a block diagram schematically showing a configuration of an exemplary semiconductor memory apparatus including a data output device according to one embodiment of the present invention.

FIG. 1 is a block diagram schematically showing a configuration of an exemplary semiconductor memory apparatus including a data output device according to one embodiment of the present invention. In FIG. 1, the semiconductor memory apparatus includes a data output device 10 and a calibration section 20.

The data output device 10 includes a pre-driver unit 12 of which a driving force is controlled by control signals (hereinafter, referred to as an 'impedance control signal') 'A1' and 'A5' that are provided from a mode register (not shown). The data output device 10 also includes a main-driver unit 14 of which an impedance is controlled by pull-up and pull-down resistance codes 'PCODE' and 'NCODE' that are provided from the calibration section 20.

The calibration section 20 can generate the pull-up and pull-down resistance control codes 'PCODE' and 'NCODE' according to the impedance control signals 'A1' and 'A5'. The calibration section 20 controls and outputs the pull-up and pull-down resistance control codes 'PCODE' and 'NCODE' to compensate for when an output impedance is varied due to a variation in at least one of a process, voltage, and temperature.

In accordance with the specification of the Joint Electron Device Engineering Council (JEDEC), an impedance of a data output device may be set to either RZQ/6 or RZQ/7 with respect to DDR3.

The impedance of the data output device 10 is set by address signals 'A1' and 'A5' when bank addresses 'BA0' and 'BA1' (not shown) are inputted as 1 and 0 and a mode register MR1 (not shown) is selected at the time of giving a mode register set (MRS) command. For example, when the address signals 'A1' and 'A5' are 0 and 0, the output impedance is set to RZQ/6. Further, when the address signals 'A1' and 'A5' are 1 and 0, the output impedance is set to RZQ/7. Herein, RZQ can be set to 240Ω, RZQ/6 can be set to 40Ω, and RZQ/7 can be set to 34Ω.

As the impedance of the data output device is set to RZQ/6 or RZQ/7, an output load of data 'DATA' varies, such that a slew rate of an output signal 'ODATA' may vary. For example, the output load of the data 'DATA' increases and the slew rate of the output signal 'ODATA' decreases when the output impedance is set to RZQ/6 in comparison to the case when the output impedance is set to RZQ/7.

In order to complement that, the data output device 10 can reduce a slew rate variance width of the output signal 'ODATA' by providing a pre-driven data signal 'IDATA' that is outputted by controlling the driving force of the pre-driver unit 12 according to the impedance control signals 'A1' and 'A5' provided by the mode register in order to set the impedance.

Figure 2:
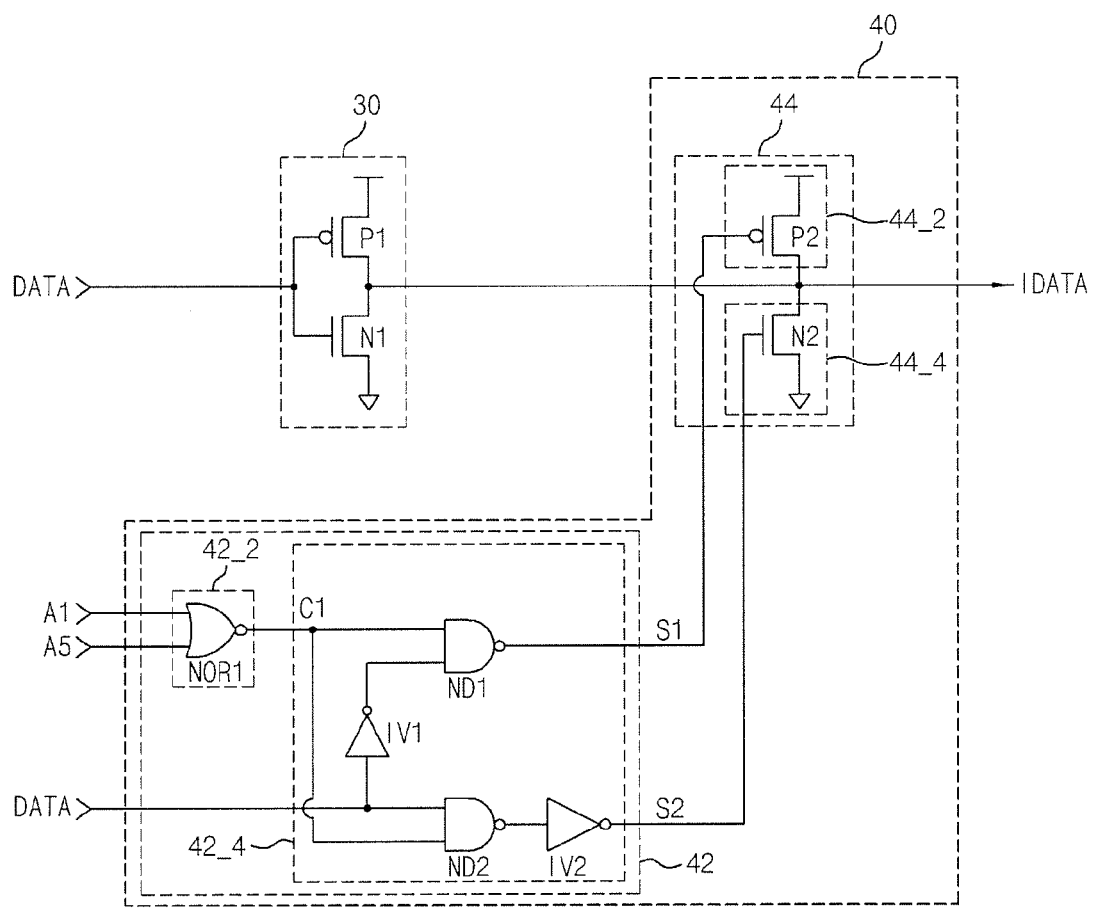
FIG. 2 is a circuit diagram showing a configuration of an exemplary pre-driver unit shown in FIG. 1 according to one embodiment of the present invention.

FIG. 2 is a circuit diagram showing a configuration of an exemplary pre-driver unit shown in FIG. 1 according to one embodiment of the present invention. In FIG. 2, the pre-driver unit 12 includes a pre-driver 30 and a driving force controller 40.

According to the embodiment shown in FIG. 2, the pre-driver 30 includes a PMOS transistor P1 and an NMOS transistor N1 connected in series between a power voltage terminal and a ground voltage terminal. The pre-driver 30 drives data 'DATA' that is applied to a common gate of the PMOS transistor P1 and the NMOS transistor N1 and outputs the data 'DATA' through a common drain terminal of the transistors.

The driving force controller 40 can include a driving control signal generator 42 and a driving force correction driver 44. The driving force controller 40 outputs the pre-driving signal 'IDATA' by controlling a slew rate of a signal outputted from the pre-driver 30 according to the impedance control signals 'A1' and 'A5'.

The driving control signal generator 42 can include a determination portion 42_2 to output a determination signal 'C1' by determining an impedance set by the impedance control signals 'A1' and 'A5'. An output portion 42_4 outputs pull-up and pull-down driving control signals 'S1' and 'S2' that correspond to the data 'DATA' according to the determination signal 'C1'.

The determination portion 42_2 may be comprised of a NOR gate NOR1. The determination portion 42_2 outputs the determination signal 'C1' in response to the impedance set by the impedance control signals 'A1' and 'A5'. That is, as described above, when the impedance control signals 'A1' and 'A5' are 0 and 0, the output impedance is set to RZQ/6. Where the output impedance is set to RZQ/6, the determination portion 42_2 determines that the output impedance is larger than RZQ/7 to output the determination signal 'C1' by setting the determination signal 'C1' to a logic level high to control the slew rate of the signal outputted from the pre-driver 30.

The output portion 42_4 includes inverters IV1 and IV2 and NAND gates ND1 and ND2. The output portion 42_4 outputs the pull-up and pull-down driving control signals 'S1' and 'S2' in response to the data 'DATA' when the determination signal 'C1' is set to a logic level high.

More specifically, the inverter IV1 inverts the data 'DATA' and supplies the inverted data 'DATA' to the NAND gate ND1 along with the determination signal 'C1' to output the pull-up driving control signal 'S1'. The NAND gate ND2 receives the determination signal 'C1' and the data 'DATA' and the inverter IV2 outputs the pull-down driving control signal 'S2' by inverting an output of the NAND gate ND2.

That is, when the determination signal 'C1' is deactivated (not set) to a logic level low, the output portion 42_4 outputs the pull-up driving control signal 'S1' to a logic level high and the pull-down driving control signal 'S2' to a logic level low to deactivate the driving correction driver 44.

On the contrary, when the determination signal 'C1' is activated (set) to a logic level high, the output portion 42_4 outputs the pull-up and pull-down driving control signals 'S1' and 'S2' to a logic level low to pull-up and drive the driving correction driver 44 when the data 'DATA' is applied at a logic level low. Further, when the determination signal 'C1' is activated to a logic level high, the output portion 42_4 outputs the pull-up and pull-down driving control signals 'S1' and 'S2' to a logic level high to pull-down and drive the driving correction driver 44 when the data 'DATA' is applied at a logic level high.

The driving correction driver 44 includes a pull-up driving portion 44_2 and a pull-down driving portion 44_4. The driving correction driver 44 pulls-up or pulls-down according to the pull-up and pull-down driving control signals 'S1' and 'S2' and outputs the pre-driving signal 'IDATA' by controlling the slew rate of the signal outputted from the pre-driver 30.

The pull-up driving portion 44_2 may be comprised of a PMOS transistor P2 is connected between the power voltage terminal and an output terminal of the pre-driver 30. The pull-up driving portion 44_2 is controlled according to the pull-up driving control signal 'S1' applied to a gate thereof to control a rising slew rate of the signal outputted from the pre-driver 30.

The pull-down driving portion 44_4 may be comprised of an NMOS transistor N2 that is connected between the output terminal of the pre-driver 30 and the ground voltage terminal. The pull-down driving portion 44_4 is controlled according to the pull-down driving control signal 'S2' applied to a gate thereof to control a falling slew rate of the signal outputted from the pre-driver 30.

That is, the pre-driver unit 12 can output the pre-driving signal 'IDATA' having a slew rate that is controlled according to the set impedance.

Figure 3:
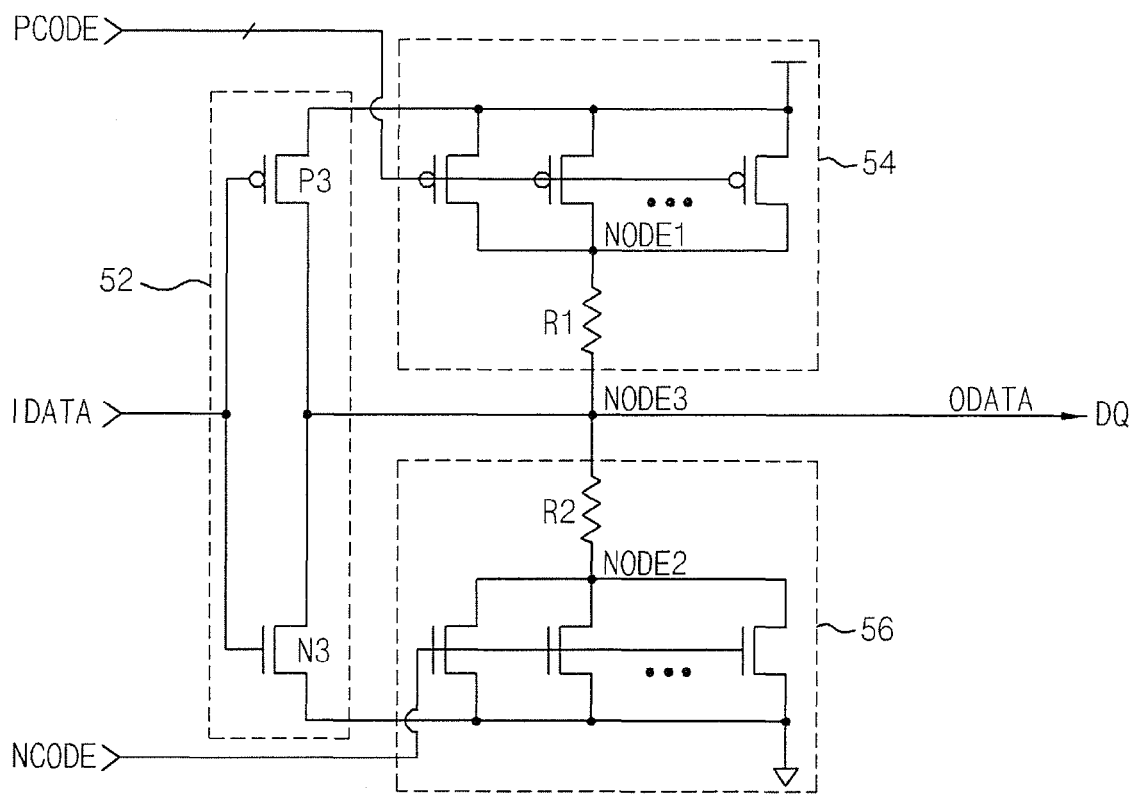
FIG. 3 is a circuit diagram showing a configuration of an exemplary main-driver unit shown in FIG. 1 according to one embodiment of the present invention.

FIG. 3 is a circuit diagram showing a configuration of an exemplary main-driver unit shown in FIG. 1 according to one embodiment of the present invention. In FIG. 3, the main-driver unit 14 includes a main-driver 52, a pull-up resistor 54, and a pull-down resistor 56.

The main-driver 52 can include a PMOS transistor P3 and an NMOS transistor N3 connected in series between the power voltage terminal and the ground voltage terminal. The main-driver 52 can drive the pre-driving signal 'IDATA' that is applied to the gate of the PMOS transistor P3 and the NMOS transistor N3 and output the output signal 'ODATA' through a node NODE3 of a common drain terminal.

The pull-up resistor 54 can include a plurality of PMOS transistors connected in parallel between the power voltage terminal and a node NODE1, and a resistor R1 that is connected between the node NODE1 and the node NODE3. The pull-up resistor 54 is controlled by the PMOS transistors that operate according to the pull-up resistance control code 'PCODE' to control a pull-up resistance.

The pull-down resistor 56 can be configured to include a plurality of NMOS transistors connected in parallel between the ground voltage terminal and a node NODE2, and a resistor R2 that is connected between the node NODE2 and the node NODE3. The pull-down resistor 56 is controlled by the NMOS transistors that operate according to the pull-down resistance control code 'NCODE' to control a pull-down resistance.

An operation of the semiconductor memory apparatus will be described with reference to FIGS. 1-3.

In the pre-driver unit 12, the pre-driver 30 drives the data 'DATA' read from a cell array (not shown) and the driving force controller 40 controls the driving force of the pre-driver 30 in correspondence with the output impedance set in the main-driver unit 14 according to the impedance control signals 'A1' and 'A5', such that the slew rate of the pre-driving signal 'IDATA' applied to the main-driver unit 14 is corrected and outputted.

For example, when the output impedance of the main-driver unit 14 is set to RZQ/6, the output load of the data 'DATA' increases as compared to the case where the output impedance is set to RZQ/7, such that the slew rate of the output signal 'ODATA' outputted from the main-driver 14 decreases. In order to complement that, the pre-driver unit 12 increases the slew rate of the pre-driving signal 'IDATA' by driving the driving force controller 40. On the contrary, when the output impedance of the main-driver unit 14 is set to RZQ/7, the pre-driver unit 12 deactivates the driving force controller 40 and outputs the output signal of the pre-driver 30 as the pre-driving signal 'IDATA'.

The main-driver unit 14 matches the set impedance by controlling the pull-up and pull-down resistances according to the pull-up and pull-down resistance control codes 'PCODE' and 'NCODE', controls the slew rate, and outputs the output signal 'ODATA' by driving the pre-driving signal 'IDATA'.

The calibration section 20 shown in FIG. 1 generates and outputs the pull-up and pull-down resistance control codes 'PCODE' and 'NCODE' according to the impedance control signals 'A1' and 'A5' provided from the mode register (not shown) in order to control and set the impedance of the main-driver unit 14 to any one of RZQ/6 and RZQ/7.

As described above, the semiconductor memory apparatus can reduce the slew rate variance width of the output signal 'ODATA' by preemptively correcting the slew rate of the pre-driving signal 'IDATA' that is outputted to the main-driver unit 14 according to the variation of the impedance set in the main-driver unit 14. As a result, signal integrity and the data eye can be enhanced.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. A data output device, comprising:
   a pre-driver unit configured to control a driving force according to an impedance control signal and drive data to output by the driving force, the pre-driver unit comprising:
   a pre-driver configured to drive the data to output; and
   a driving force controller of which driving is controlled according to the impedance control signal to correct and output a slew rate of a signal outputted from the pre-driver; and
   a main-driver unit configured to control an impedance according to pull-up and pull-down resistance control codes having values that correspond to the impedance control signal and to drive an output of the pre-driver unit by using the controlled impedance, wherein the impedance control signal is an address signal provided from a mode register in order to set any one of a first resistance value and a second resistance value as the impedance, the second resistance value being larger than the first resistance value, wherein the main-driver unit includes:

a main-driver configured to drive an output from the pre-driver unit;

a pull-up resistor which is connected between a power voltage terminal and an output terminal of the main-driver and controls a pull-up resistance of the impedance according to the pull-up resistance control code; and a pull-down resistor which is connected between a ground voltage terminal and the output terminal of the main-driver and controls a pull-down resistance of the impedance according to the pull-down resistance control code.

2. The data output device according to claim 1, wherein the driving force controller includes:

a driving control signal generator configured to generate pull-up and pull-down driving control signals according to the impedance control signal; and a driving correction driver of which driving is controlled according to the pull-up and pull-down driving control signals from the driving control signal generator to correct the slew rate of the signal outputted from the pre-driver.

3. The data output device according to claim 2, wherein the driving control signal generator includes:

a determination portion configured to determine an impedance set by the impedance control signal and output a determination signal; and an output portion configured to output the pull-up and pull-down driving control signals corresponding to the data to output in response to the determination signal.

4. The data output device according to claim 3, wherein the output portion is configured to output the pull-up and pull-down driving control signals so that the driving correction driver is pull-up or pull-down driven in correspondence with the data when the determination signal is activated.

5. The data output device according to claim 2, wherein the driving correction driver includes:

a pull-up driving portion configured to correct a rising slew rate of the signal outputted from the pre-driver by being pull-up driven according to the pull-up driving control signal; and a pull-down driving portion configured to correct a falling slew rate of the signal outputted from the pre-driver by being pull-down driven according to the pull-down driving control signal.

6. The data output device according to claim 5, wherein the pull-up driving portion is a PMOS transistor connected between the power voltage terminal and an output terminal of the pre-driver and is controlled according to the pull-up driving control signal applied to a gate of the PMOS transistor.

7. The data output device according to claim 5, wherein the pull-down driving portion is an NMOS transistor connected between the output terminal of the pre-driver and the ground voltage terminal and is controlled according to the pull-down driving control signal applied to a gate of the NMOS transistor.

8. A semiconductor memory apparatus, comprising:

a calibration section configured to output pull-up and pull-down resistance control codes for matching an impedance according to an impedance control signal, wherein the impedance control signal is an address signal provided from a mode register in order to set any one of a first resistance value and a second resistance value as the impedance, the second resistance value being larger than the first resistance value;

a pre-driver unit configured to control a driving force according to the impedance control signal and drive data to output by the driving force, the pre-driver unit comprising:

a pre-driver configured to drive the data to output;

a driving control signal generator configured to generate pull-up and pull-down driving control signals corresponding to the data to output according to the impedance control signal; and a driving correction driver which is driven according to the pull-up and pull-down driving control signals from the driving control signal generator and controls a slew rate of a signal outputted from the pre-driver; and a main-driver unit configured to control the impedance according to the pull-up and pull-down resistance control codes and to drive an output of the pre-driver unit by using the controlled impedance.

9. The semiconductor memory apparatus according to claim 8, wherein the driving control signal generator is configured to output the pull-up and pull-down driving control signals in correspondence with the data when the impedance is set to the second resistance value by the impedance control signal.

10. The semiconductor memory apparatus according to claim 8, wherein the driving correction driver is pull-up or pull-down driven according to the pull-up and pull-down driving control signals to increase a rising slew rate or a falling slew rate of the signal outputted from the pre-driver.

11. The semiconductor memory apparatus according to claim 8, wherein the main-driver unit includes:

a main-driver configured to drive the output from the pre-driver unit; and a resistor connected to an output terminal of the main-driver to control the impedance according to the pull-up and pull-down resistance control codes.

* * * * *